US009184077B2

(12) United States Patent
Yang et al.

(10) Patent No.: US 9,184,077 B2
(45) Date of Patent: Nov. 10, 2015

(54) WAFER POD AND WAFER POSITIONING MECHANISM THEREOF

(71) Applicant: Taiwan Semiconductor Manufacturing Co., Ltd, Hsin-Chu (TW)

(72) Inventors: Sung-Chun Yang, Hsinchu (TW); Ying-Chi Peng, Zhudong Township, Hsinchu County (TW); Yao-Pin Yang, Zhubei (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 222 days.

(21) Appl. No.: 14/040,888

(22) Filed: Sep. 30, 2013

(65) Prior Publication Data

US 2015/0090630 A1 Apr. 2, 2015

(51) Int. Cl.
*H01L 21/673* (2006.01)

(52) U.S. Cl.
CPC .............................. *H01L 21/67369* (2013.01)

(58) Field of Classification Search
CPC combination set(s) only.
See application file for complete search history.

(56) References Cited

U.S. PATENT DOCUMENTS

| 6,098,809 | A | 8/2000 | Okada et al. |
| 6,267,245 | B1 | 7/2001 | Bores et al. |
| 7,523,830 | B2 | 4/2009 | Burns et al. |
| 2004/0040884 | A1 | 3/2004 | Pai et al. |
| 2007/0154231 | A1 | 7/2007 | Ichimura et al. |
| 2008/0041759 | A1* | 2/2008 | Chiu et al. ..................... 206/710 |
| 2009/0021829 | A1 | 1/2009 | Chen et al. |
| 2010/0032339 | A1 | 2/2010 | Hasegawa et al. |
| 2011/0266192 | A1 | 11/2011 | Chiu et al. |
| 2013/0146503 | A1 | 6/2013 | Wang et al. |
| 2013/0299384 | A1 | 11/2013 | Fuller |
| 2014/0197068 | A1* | 7/2014 | Cho et al. ....................... 206/711 |

FOREIGN PATENT DOCUMENTS

| CN | 101119912 | 2/2008 |
| JP | 2011-2339 | 11/2011 |
| TW | 412824 | 11/2000 |
| TW | 1225839 | 1/2005 |
| TW | M309202 | 4/2007 |
| TW | M319925 | 10/2007 |
| TW | M352130 | 3/2009 |
| TW | I337973 | 3/2011 |

(Continued)

OTHER PUBLICATIONS

English language translation of abstract of TW 412824 (published Nov. 21, 2000).

(Continued)

*Primary Examiner* — Jacob K Ackun
(74) *Attorney, Agent, or Firm* — McClure, Qualey & Rodack, LLP

(57) ABSTRACT

Embodiments of mechanisms of a wafer pod including a wafer positioning mechanism are provided. The wafer positioning mechanism includes a base including a blocking portion, and a linking bar pivoted on the base and including a resilient portion. The wafer positioning mechanism also includes a pushing element pivoted on the linking shaft. Further, when the pushing element is at a retaining position, the resilient portion abuts against the blocking portion, and a force generated by the linking bar is applied to the pushing element.

20 Claims, 14 Drawing Sheets

(56) References Cited

FOREIGN PATENT DOCUMENTS

TW    I347648    8/2011
TW    M429684    5/2012

OTHER PUBLICATIONS

English language translation of abstract of TW I225839 (published Jan. 1, 2005).
English language translation of abstract of TW M352130 (published Mar. 1, 2009).
English language translation of abstract of TW I337973 (published Mar. 1, 2011).
English language translation of abstract of TW I347648 (pp. 3-4 of publication, published Aug. 21, 2011).
English language translation of abstract of TW M429684 (published May 21, 2012).
Taiwanese language office action dated Jun. 2, 2015, issued in application No. 103100777.
Notice of Allowance issued in related U.S. Appl. No. 14/040,902, mailed on Aug. 27, 2014.

* cited by examiner

US 9,184,077 B2

WAFER POD AND WAFER POSITIONING MECHANISM THEREOF

BACKGROUND

In the semiconductor industry, wafers are contained in wafer pods to prevent the wafers from pollution. In general, the wafers are inserted into a cassette of the wafer pod, and a wafer locker is used to fix the wafers in the cassette and to prevent the wafers from damage during transportation of the wafer pod.

The wafer locker is detachably disposed on the wafer pod to benefit the washing of the wafer pod. However, due to the detachable structure of the wafer locker, some parts of the wafer locker may drop off and damage the wafers.

Further, some particles may be generated by some assembled parts of the wafer pod, and the particles may fall down on the wafers. In addition, after the wafer pod is washed, some water may remain in the grooves of the pod shell, and the wafers may be polluted by the water remaining in the pod shell.

Therefore, there are challenges to improve the structure of the wafer pods.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Various features may be arbitrarily drawn in different scales for the sake of simplicity and clarity. Furthermore, the formation of a first feature over or on a second feature in the description may include embodiments in which the first and second features are formed in direct or indirect contact.

Figure 1:
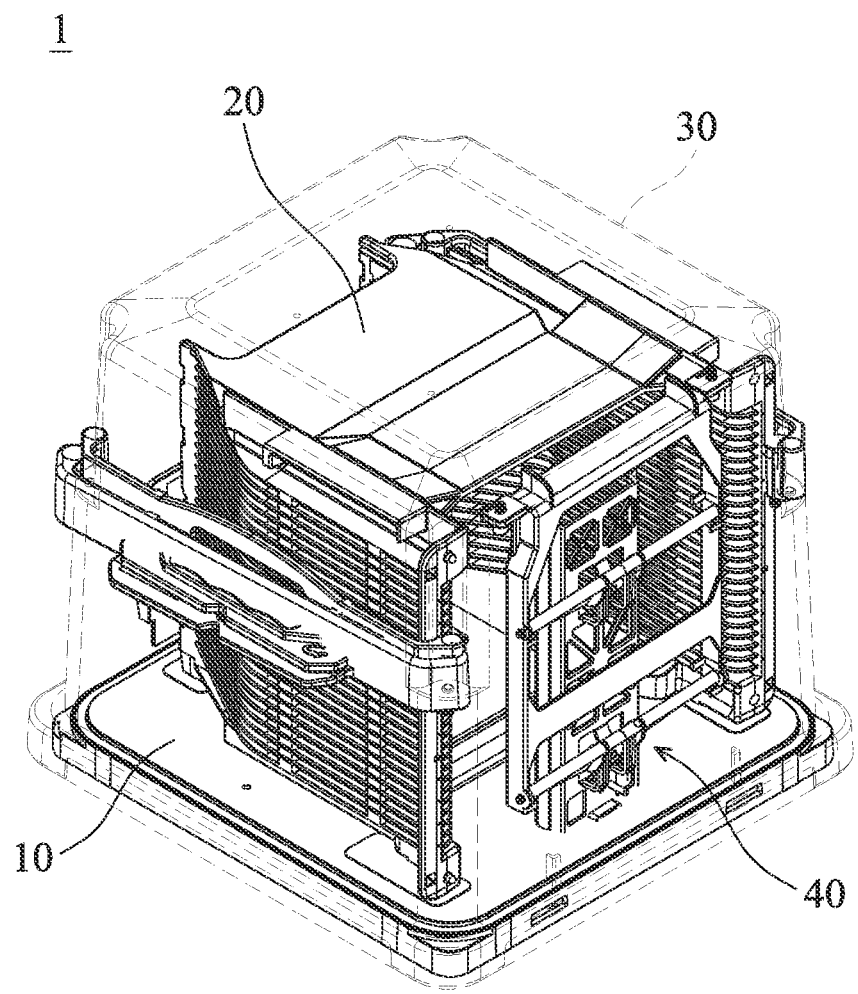
FIG. 1 is a perspective view of a wafer pod in accordance with some embodiments of the disclosure.
Figure 2:
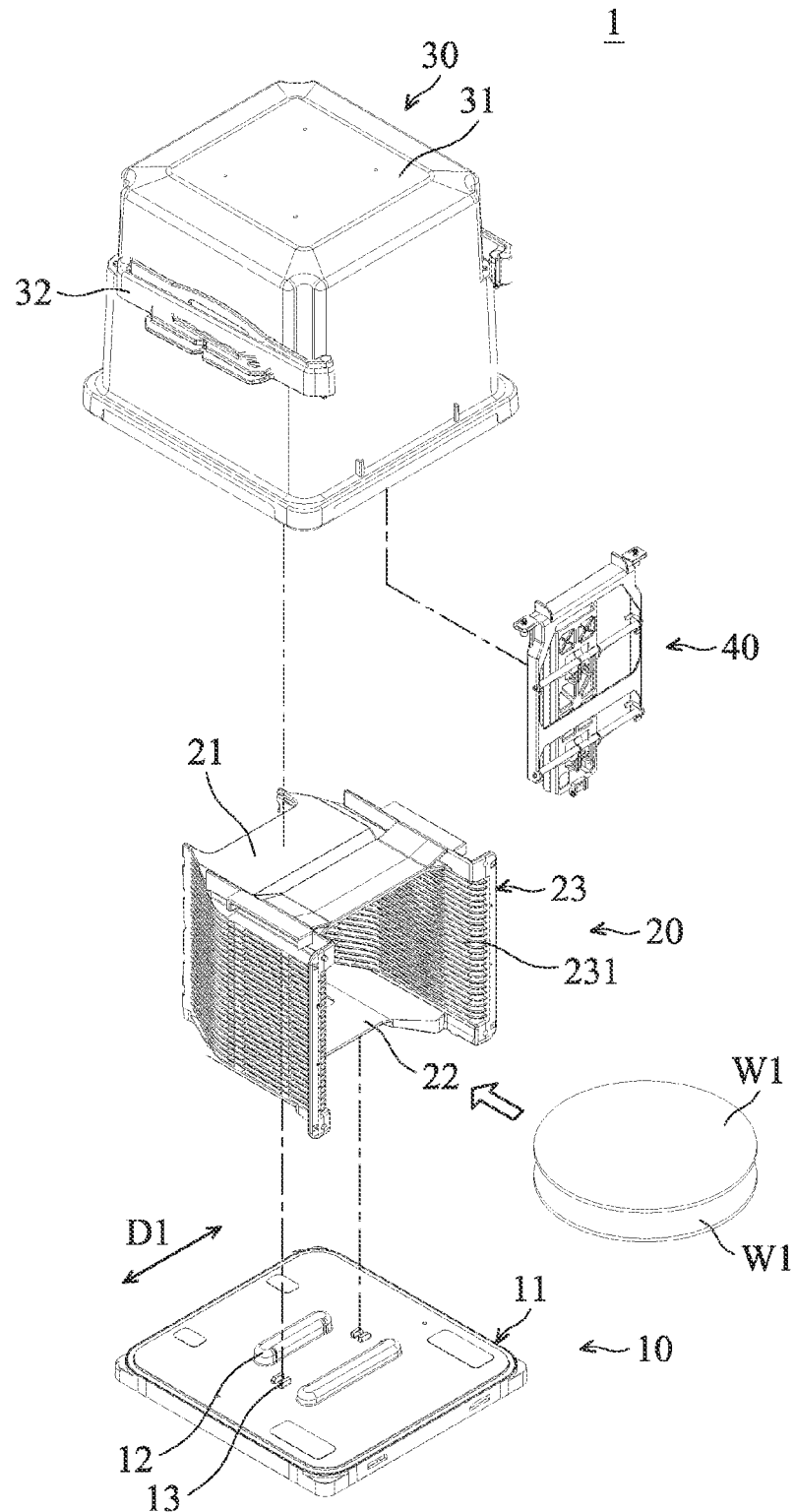
FIG. 2 is an exploded view of the wafer pod in accordance with some embodiments of the disclosure.

FIG. 1 is a perspective view of a wafer pod 1 in accordance with some embodiments of the disclosure. FIG. 2 is an exploded view of wafer pod 1 in accordance with some embodiments of the disclosure. Wafer pod 1 is used for containing wafers W1 (as shown in FIG. 2). Wafer pod 1 includes a pod door 10, a cassette 20, a pod shell 30, and a wafer positioning mechanism 40. Cassette 20 is disposed on pod door 10 and contains wafers W1. Pod shell 30 is detachably disposed on pod door 10, and covers cassette 20. Wafer positioning mechanism 40 is disposed on an inner wall of pod shell 30. Wafer positioning mechanism 40 is for retaining wafers W1 in cassette 20.

Figure 3:
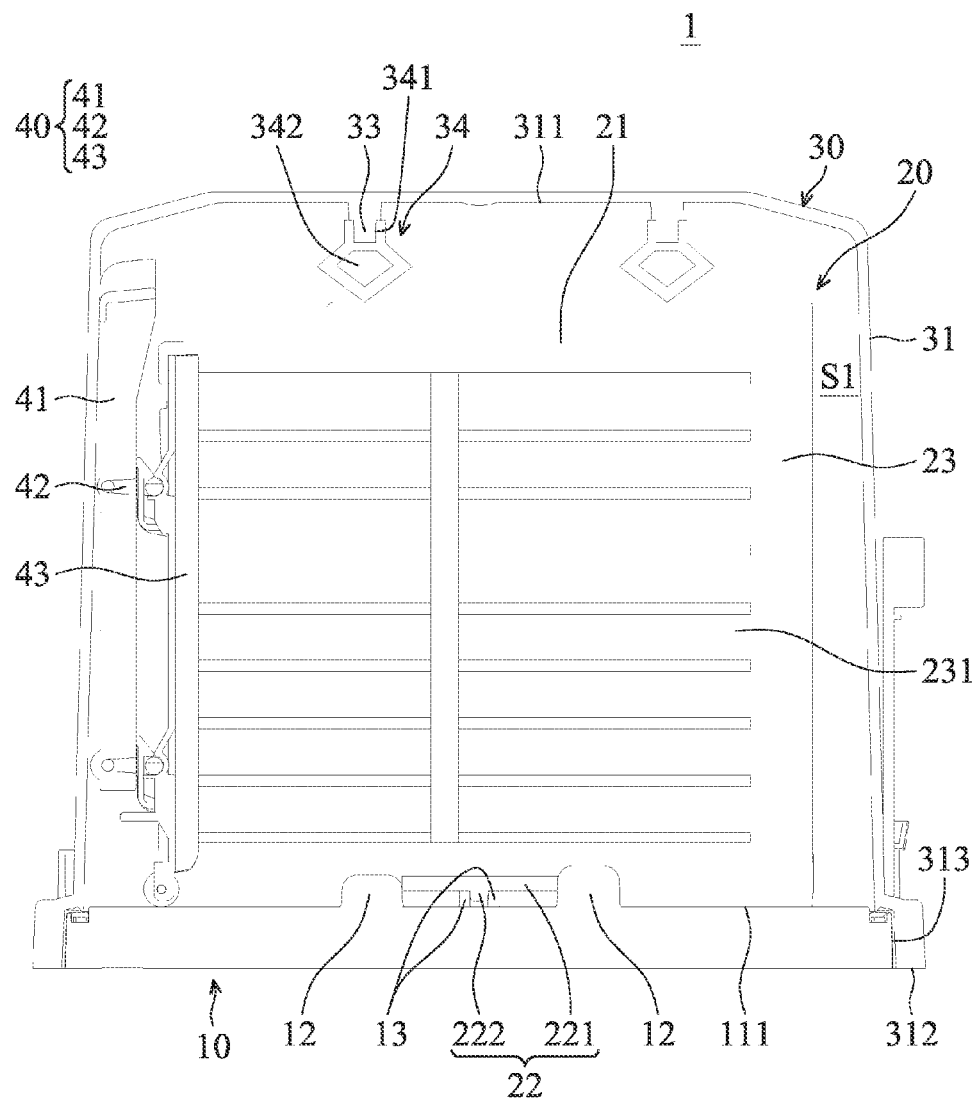
FIG. 3 is a cross-sectional view of the wafer pod in accordance with some embodiments of the disclosure.
Figure 4:
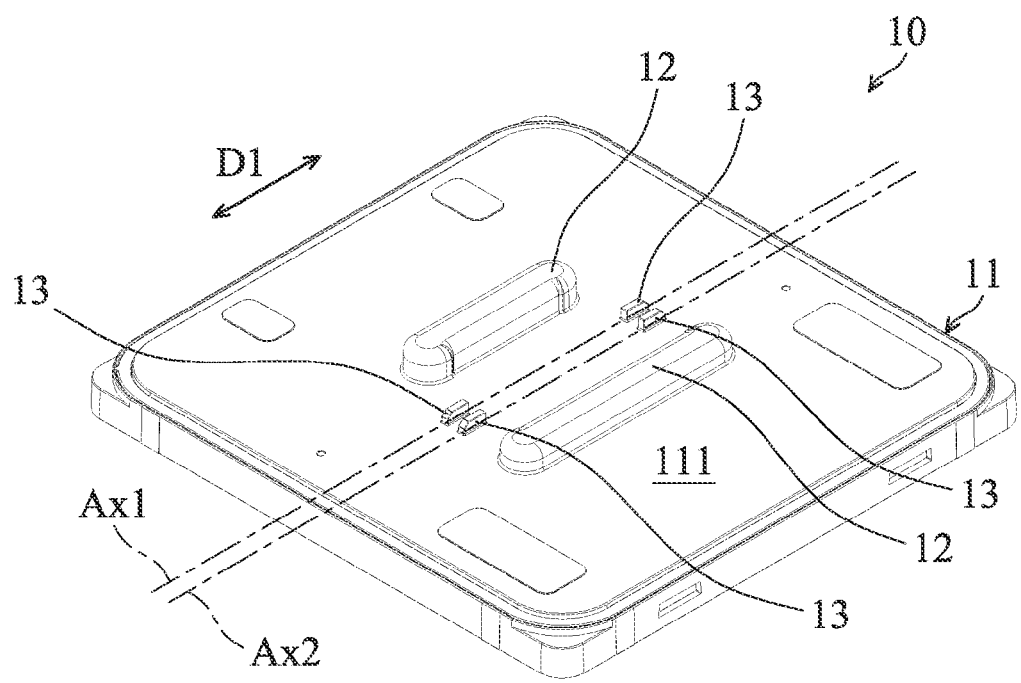
FIG. 4 is a perspective view of the pod door in accordance with some embodiments of the disclosure.

FIG. 3 is a cross-sectional view of wafer pod 1 in accordance with some embodiments of the disclosure. FIG. 4 is a perspective view of pod door 10 in accordance with some embodiments of the disclosure. Pod door 10 is a plate structure. In some embodiments, pod door 10 includes a pod housing 11, outer retaining protrusions 12, and inner retaining protrusions 13. Outer retaining protrusions 12 and inner retaining protrusions 13 are disposed on a top surface 111 of pod housing 11. In some embodiments, there are two outer retaining protrusions 12 and four inner retaining protrusions 13 in FIG. 2.

In some embodiments, outer retaining protrusions 12 are parallel to each other and extend along an extension direction D1. Inner retaining protrusions 13 are substantially between two adjacent outer retaining protrusions 12. Namely, inner retaining protrusions 13 are respectively extended along axes AX1 and AX2, which are between two adjacent outer retaining protrusions 12. The distance between two adjacent outer retaining protrusions 12 exceeds that of two adjacent inner retaining protrusions 13. In some embodiments, pod housing 11, and outer retaining protrusions 12 and inner retaining protrusions 13 are formed as a single piece.

Cassette 20 includes a top portion 21, a bottom portion 22, and two side walls 23. Side walls 23 are connected with top portion 21 and bottom portion 22, and located between top portion 21 and bottom portion 22. In some embodiments, top portion 21 and bottom portion 22 are substantially parallel to each other. Side walls 23 are substantially parallel to each other. Further, side walls 23 are substantially perpendicular to top portion 21 and bottom portion 22.

In some embodiments, cassette 20 is a hollow structure. Cassette 20 and wafer positioning mechanism 40 are made of temperature resistance materials, such as polyetheretherketone (PEEK), polyetherimide (PEI), or polybenzimidazole (PBI). In some embodiments, the thermal tolerance of cassette 20 is about in a range from about 150° C. to about 350° C. Therefore, wafer W1 may be putted into cassette 20 having a temperature greater than 100° C., and is not stuck on cassette 20. In some embodiments, the materials of cassette 20 and wafer positioning mechanism 40 are different or the same.

Side walls 23 have wafer slots 231, and wafers W1 may be received in wafer slots 231. Wafer slots 231 are parallel to and distant from each other, and therefore, wafers W1 received in wafer slots 231 are parallel to and distant from each other, too. In some embodiments, only the edge of wafer W1 contacts with wafer slots 231. Therefore, the top and bottom surfaces within the edge of wafer W1 may not be damaged when wafer W1 is inserted into cassette 20 along wafer slot 231.

As shown in FIGS. 3 and 4, bottom portion 22 of cassette 20 includes a retaining plate 221 and a retaining rib 222 disposed on retaining plate 221. In some embodiments, retaining rib 222 is extended along extension direction D1. The width of retaining plate 221 is substantially the same as the distance between two adjacent outer retaining protrusions 12. The width of retaining rib 222 is substantially the same as the distance between two adjacent inner retaining protrusions 13. Therefore, when cassette 20 is disposed on pod door 10, retaining plate 221 is retained by outer retaining protrusions 12, and retaining rib 222 is retained by inner retaining protrusions 13.

If outer retaining protrusions 12 and inner retaining protrusions 13 are independent and assembled to pod housing 11, some particles may be generated from outer retaining protrusions 12 and inner retaining protrusions 13 due to the movement between outer retaining protrusions 12 and pod housing 11, and between inner retaining protrusions 13 and pod housing 11.

Since outer retaining protrusions 12 and inner retaining protrusions 13 and pod housing 11 are formed as a single piece, the particles in wafer pod 1 are decreased. Further, outer retaining protrusions 12 and inner retaining protrusions 13 do not drop off from pod housing 11 to damage wafers W1.

Pod shell 30 includes a shell body 31, handles 32, fixing protrusions 33, and damping elements 34. Handles 32 are disposed on an outer surface of shell body 31. Wafer pod 1 may be carried by holding handles 32. Further, a receiving chamber 51 is formed in shell body 31, and cassette 20 is located in receiving chamber 51.

Figure 5:
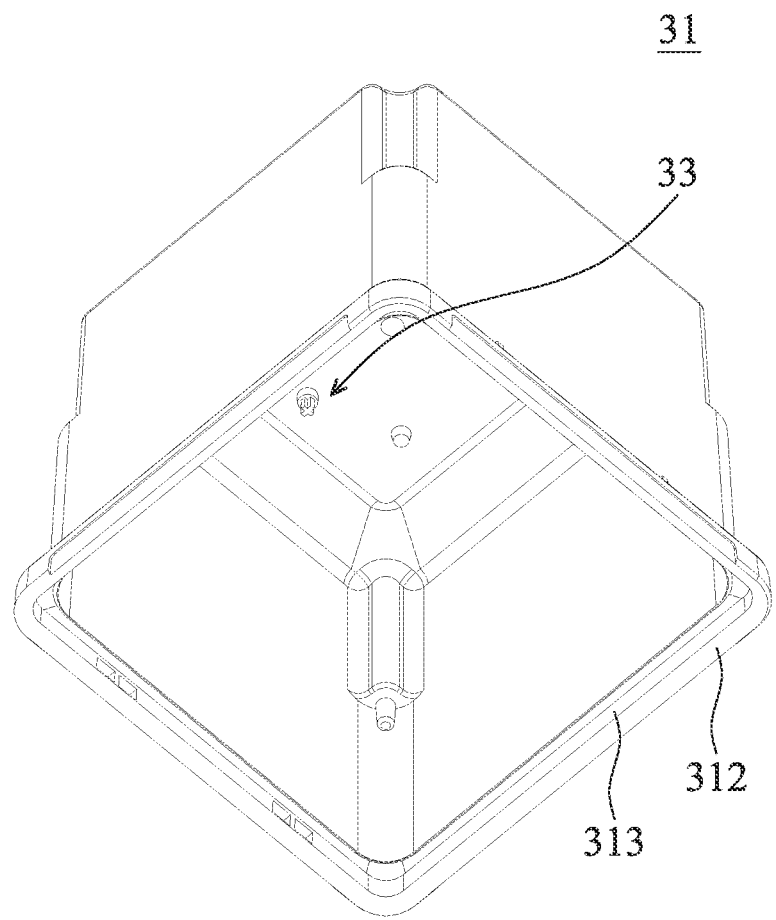
FIG. 5 is a perspective view of a shell body in accordance with some embodiments of the disclosure.

FIG. 5 is a perspective view of shell body 31 in accordance with some embodiments of the disclosure. As shown in FIGS. 3 and 5, fixing protrusions 33 are disposed on an inner surface 311 of shell body 31. Damping elements 34 are disposed on fixing protrusions 33. When pod shell 30 is disposed on pod door 10, damping elements 34 abut against top portion 21 of cassette 20. Therefore, damping elements 34 may prevent cassette 20 from colliding with shell body 31 directly, and the vibration of wafer W1 in cassette 20 may be decreased if wafer pod 1 is impacted or when wafer pod 1 is transported.

Damping element 34 includes a fixing groove 341 and a damping hole 342. Fixing protrusion 33 is detachably retained in fixing groove 341. In some embodiments, a cross section of fixing protrusion 33 is cross shaped. The cross section of fixing groove 341 is a cross shape corresponding to the cross section of fixing protrusion 33. Therefore, the rotation of fixing protrusion 33 relative to fixing groove 341 is limited. Further, the damping of damping element 34 is increased by damping hole 342.

In general, wafer pod 1 must be washed to prevent the particles in wafer pod 1 from falling down on wafers W1. Before shell body 31 is washed, handles 32 and damping element 34, for example, may be detached from shell body 31 to benefit the washing of shell body 31. After shell body 31 is washed, water or liquid will not remain on fixing protrusion 33 of shell body 31. Therefore, wafer W1 may be prevented from possible pollution by remaining water or liquid, since there is no deeper groove formed on fixing protrusion 33.

As shown in FIGS. 3 and 5, shell body 31 has a bottom surface 312 and a shell opening 313. Shell opening 313 is formed on bottom surface 312, and communicated with receiving chamber 51, and therefore, bottom surface 312 is ring shaped. In some embodiments, there is no ring-shaped groove formed on bottom surface 312. After shell body 31 is washed, water or liquid will not remain on bottom surface 312 of shell body 31. Therefore, wafer W1 may be prevented from possible pollution by remaining water or liquid since bottom surface 312 excludes any groove.

Figure 6:
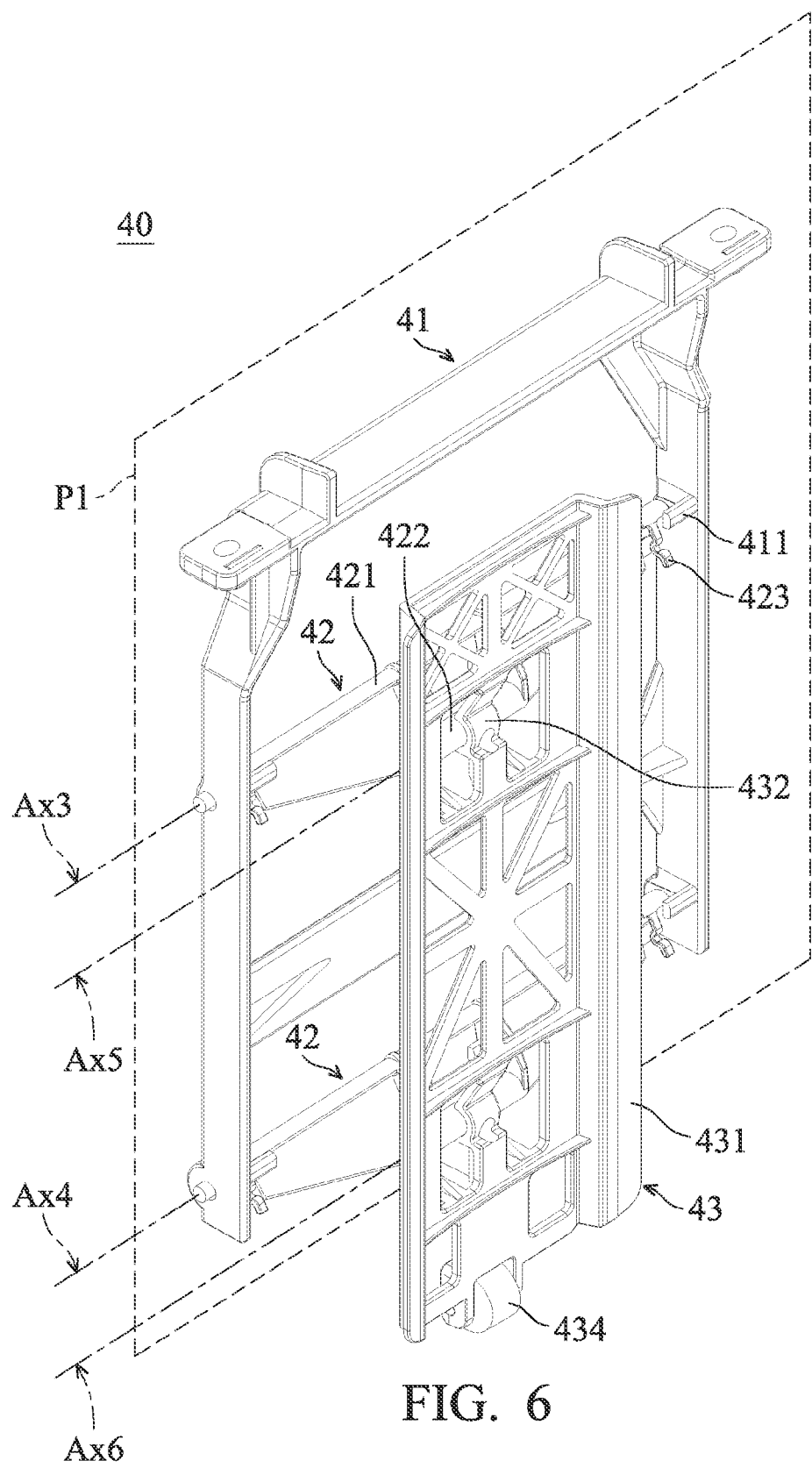
FIG. 6 is a perspective view of a wafer positioning mechanism in accordance with some embodiments of the disclosure.
Figure 7:
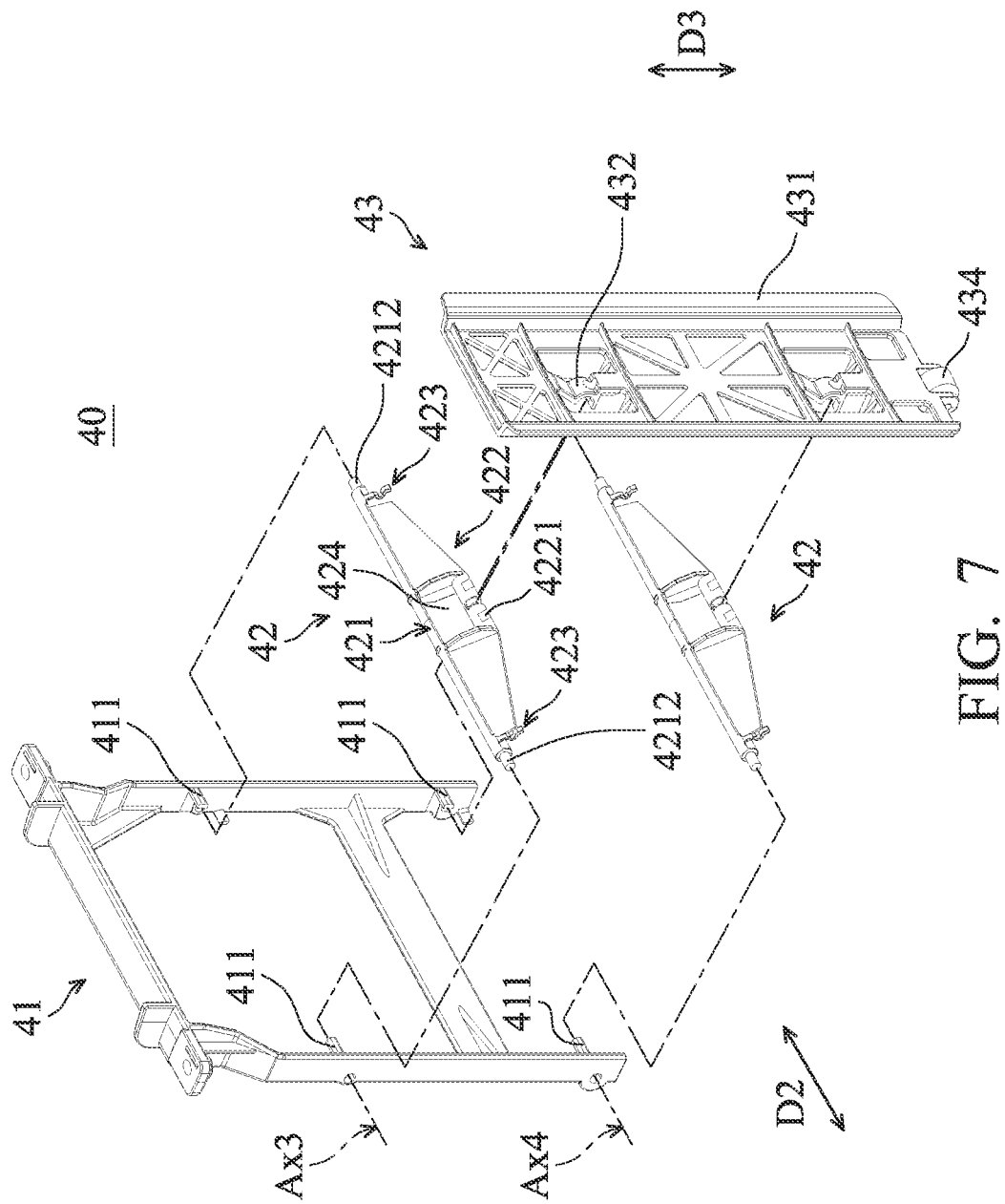
FIG. 7 is an exploded view of the wafer positioning mechanism in accordance with some embodiments of the disclosure.
Figure 8:
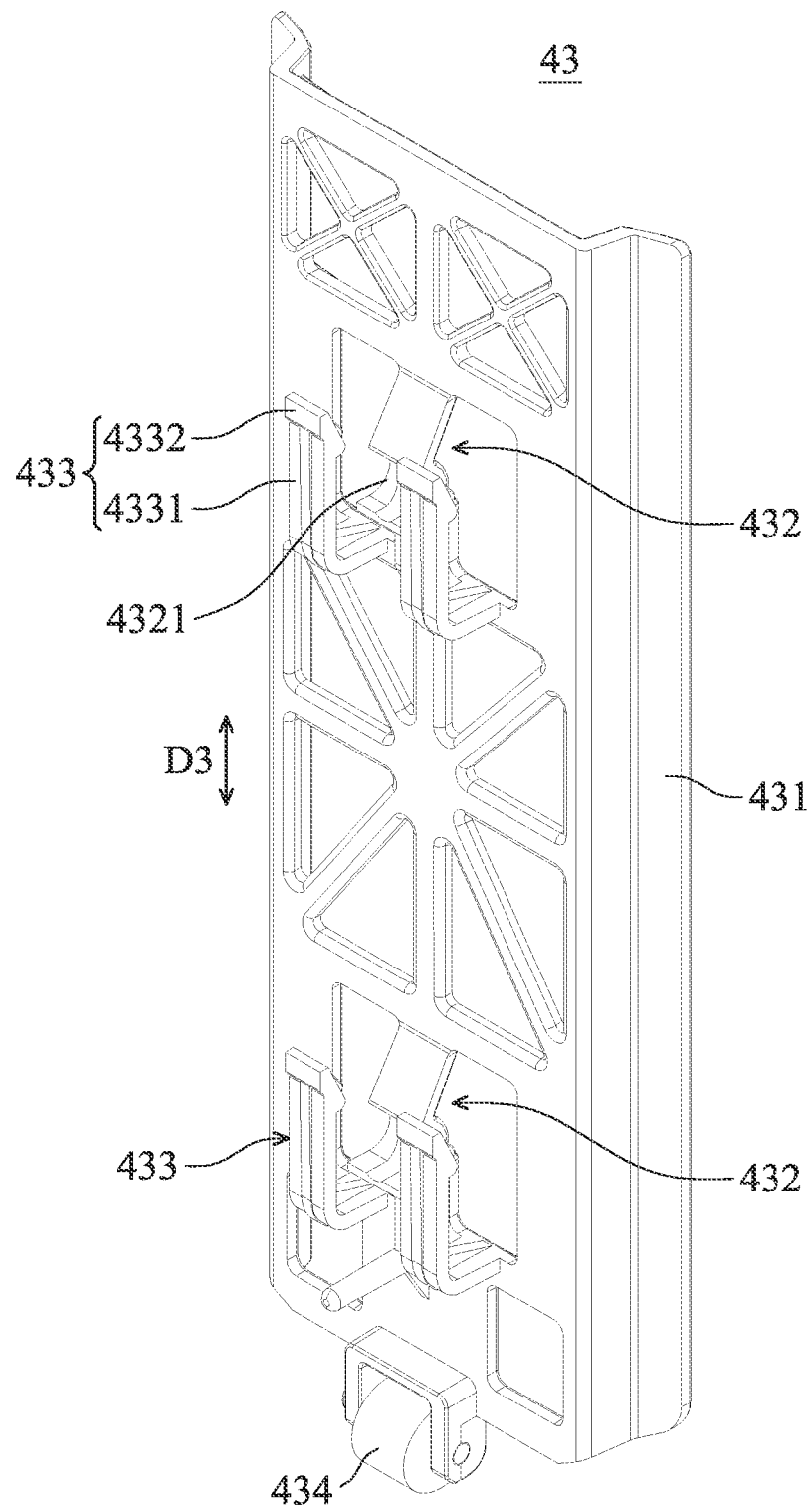
FIG. 8 is a perspective view of a pushing element in accordance with some embodiments of the disclosure.

FIG. 6 is a perspective view of a wafer positioning mechanism 40 in accordance with some embodiments of the disclosure. FIG. 7 is an exploded view of a wafer positioning mechanism 40 in accordance with some embodiments of the disclosure. FIG. 8 is a perspective view of a pushing element 43 in accordance with some embodiments of the disclosure. Wafer positioning mechanism 40 includes a base 41, linking bars 42, and pushing element 43.

Base 41 is disposed on inner surface 311 of pod shell 30. Linking bars 42 are respectively pivoted on base 41. In some embodiments, base 41 is a frame structure. Base 41 includes blocking portions 411 extended along an extension direction D2.

Linking bars 42 are respectively pivoted on base 41 about rotation axes AX3 and AX4. In some embodiments, rotation axes AX3 and AX4 are parallel to each other and located at a plane P1. Linking bar 42 is substantially extended along extension direction D2, which is parallel to rotation axes AX3 and AX4. Further, base 41 is substantially extended along plane P1.

Linking bar 42 includes a linking body 421, a linking shaft 422, and resilient portions 423. Two opposite ends 4212 of linking body 421 are respectively pivoted to base 41. Linking shaft 422 is connected to linking body 421. Resilient portions 423 are connected to linking body 421 and adjacent to ends 4212 of linking body 421. In some embodiments, a through hole 424 is formed between linking body 421 and linking shaft 422. Linking body 421, linking shaft 422, and resilient portions 423 are formed as a single piece.

In some embodiments, linking body 421 is substantially extended along extension direction D2. Linking shaft 422 is extended along extension direction D2. Linking shafts 422 respectively have a rotation axis AX5 and a rotation axis AX6. Resilient portions 423 are extended perpendicular to extension direction D2.

Pushing element 43 is pivoted on linking bars 42. Pushing element 43 selectively contacts with wafer W1 in cassette 20. Pushing element 43 includes a pushing body 431, pivoting portions 432, holding portions 433, and a wheel 434 disposed on a bottom of pushing body 431. Pivoting portions 432 are disposed on pushing body 431. Pivoting portions 432 are pivoted on linking shafts 422. In some embodiments, pivoting portion 432 has a pivoting slot 4321, and linking shaft 422 is rotatably disposed in pivoting slot 4321.

In some embodiments, pushing body 431 is a board structure. Pushing body 431, pivoting portions 432, and holding portions 433 are formed as a single piece. By linking bars 42, pushing body 431 of pushing element 43 is sustainably parallel to plane P1 during the movement of pushing element 43.

Holding portions 433 are disposed on pushing body 431. Each of holding portions 433 includes a resilient arm 4331 and a hook structure 4332. One end of resilient arm 4331 is connected to pushing body 431, and the other end of resilient arm 4331 is connected to hook structure 4332. Hook structure 4332 is adjacent to pivoting slot 4321. Linking shaft 422 is located between hook structure 4332 and pivoting slot 4321, and clamped by hook structure 4332 and pivoting slot 4321.

Holding portions 433 provide an elastic force on linking shaft 422 to prevent linking shaft 422 from leaving pivoting slot 4321. Therefore, pushing element 43 may be installed on linking shaft 422 of linking bar 42, and detached from linking shaft 422 by bending holding portions 433.

Figure 9A:
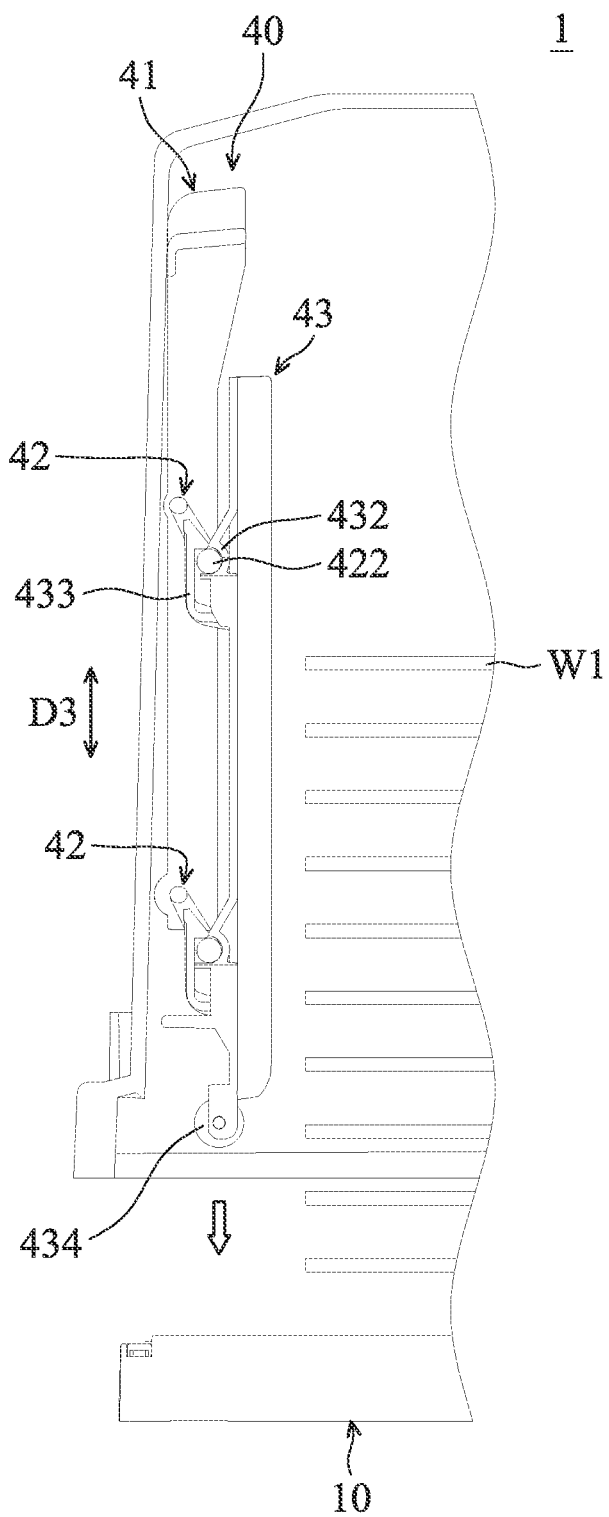
FIG. 9A is a schematic view of the wafer pod at the release position in accordance with some embodiments of the disclosure.
Figure 9B:
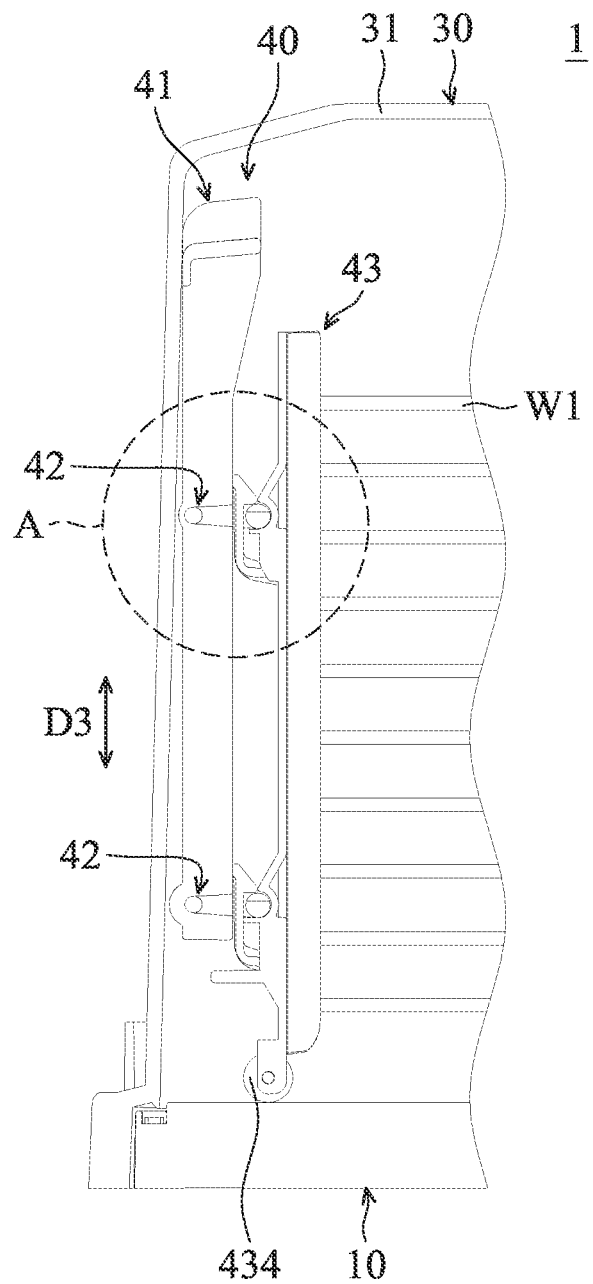
FIG. 9B is a schematic view of the wafer pod at the retaining position in accordance with some embodiments of the disclosure.
Figure 9C:
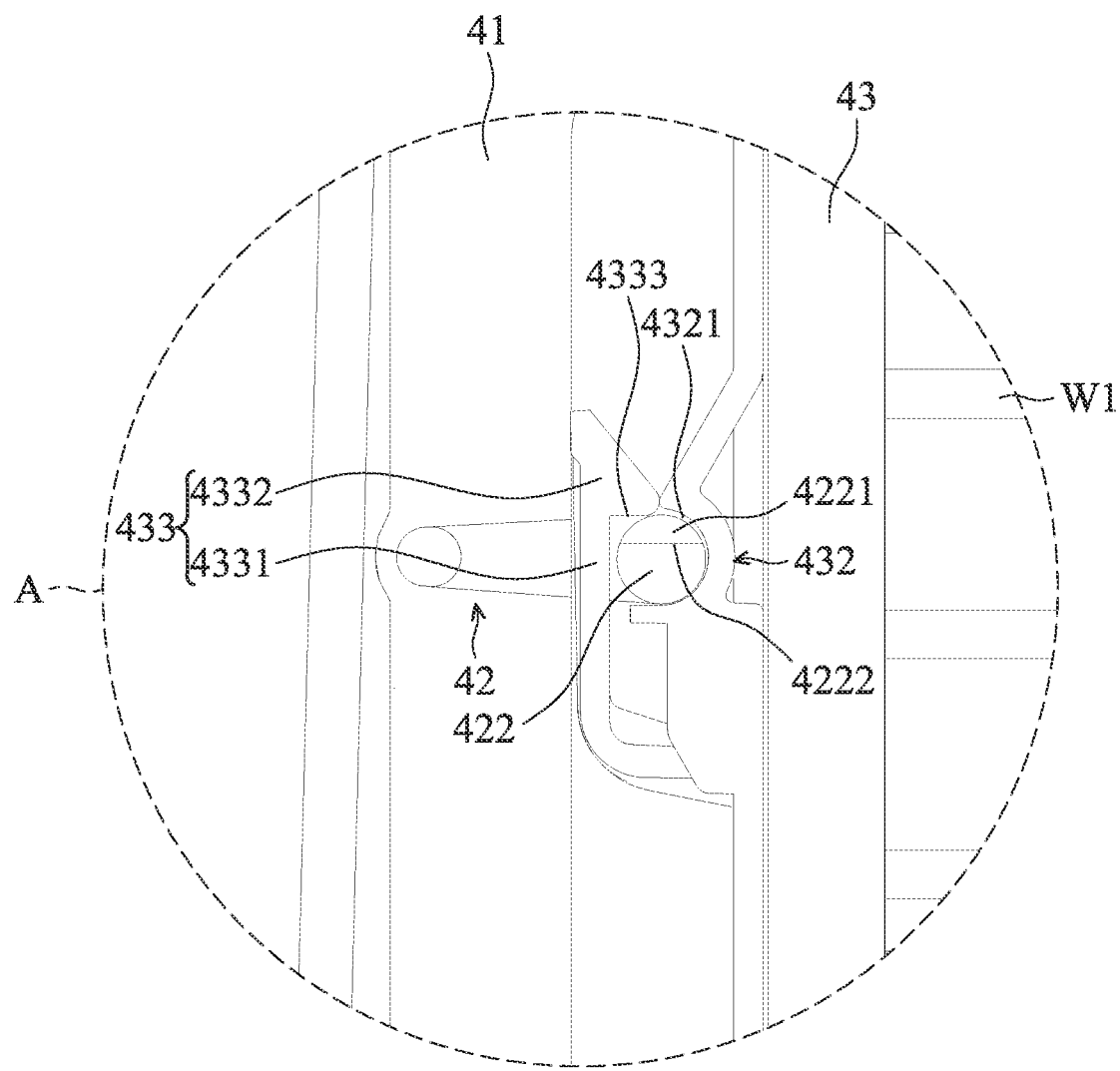
FIG. 9C is an enlarged view of part A of FIG. 9B.

FIGS. 9A and 9B are a schematic view of wafer pod 1 in accordance with some embodiments of the disclosure. FIG. 9C is an enlarged view of part A of FIG. 9B. In FIG. 9A, wafer positioning mechanism 40 is at a release position. Pushing element 43 has fallen down relative to base 41 by gravity, and therefore, pushing element 43 is close to base 41. Since pushing element 43 is close to base 41, pushing element 43 is away from wafers W1, and therefore, the bottom of pushing element 43 does not collide with wafers W1 when pod shell 30 is moved to pod door 10.

In FIGS. 9B and 9C, wafer positioning mechanism 40 is at a retaining position. As shown in FIG. 9B, pod shell 30 is disposed on pod door 10. When pod shell 30 is moving to pod door 10, pod shell 30 pushes pushing element 43 to move up and far away from base 41 when pushing element 43 contacts pod door 10. By wheel 434, pushing element 43 is moved smoothly relative to pod door 10 when pod shell 30 is moved to pod door 10.

In some embodiments, a distance between pushing element 43 and base 41 at the retaining position is farther than the distance between pushing element 43 and base 41 at the release position. Further, pushing element 43 at the retaining position is higher than pushing element 43 at the release position.

As shown in FIG. 9C, linking shaft 422 is clamped by pivoting portion 432 and holding portion 433. Linking shaft 422 may be moved out of pivoting slot 4321 by bending holding portion 433. Therefore, pushing element 43 is detachable from linking shaft 422 to benefit the washing of pod shell 30.

Linking shaft 422 has trench 4221. Hook structure 4332 of holding portion 433 has a blocking surface 4333. In some embodiments, bottom surface 4222 of trench 4221 is a flat surface. Blocking surface 4333 is a flat surface. In some embodiments, holding portion 433 is an L-shaped structure. Resilient arm 4331 is extended along an extension direction D3, and blocking surface 4333 is substantially perpendicular to extension direction D3 and plane P1 (as shown FIG. 6). Namely, blocking surface 4333 is perpendicular to resilient arm 4331.

When pushing element 43 is pushed up by pod door 10, hook structure 4332 is located in trench 4221, and bottom surface 4222 contacts with or faces blocking surface 4333. It is difficult for linking shaft 422 to be pushed away holding portion 433 by bottom surface 4222, since bottom surface 4222 and blocking surface 4333 are flat surfaces. Therefore, pushing element 43 does not easily drop off from linking bar 42 when pod shell 30 is disposed to pod door 10.

In contrast, if trench 4221 is excluded and/or blocking surface 4333 is curved, linking shaft 422 may be pushed away holding portion 433 easily, and therefore, pushing element may easily drop off from linking bar 42.

Figure 10A:
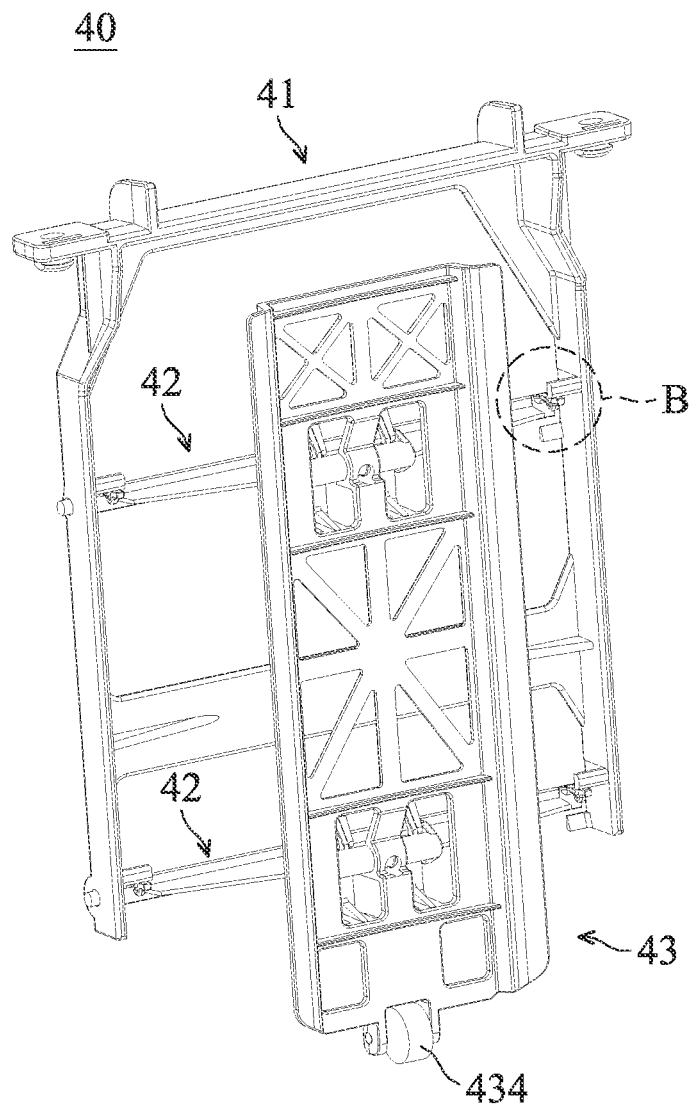
FIG. 10A is a perspective view of a wafer positioning mechanism at the retaining position in accordance with some embodiments of the disclosure.
Figure 10B:
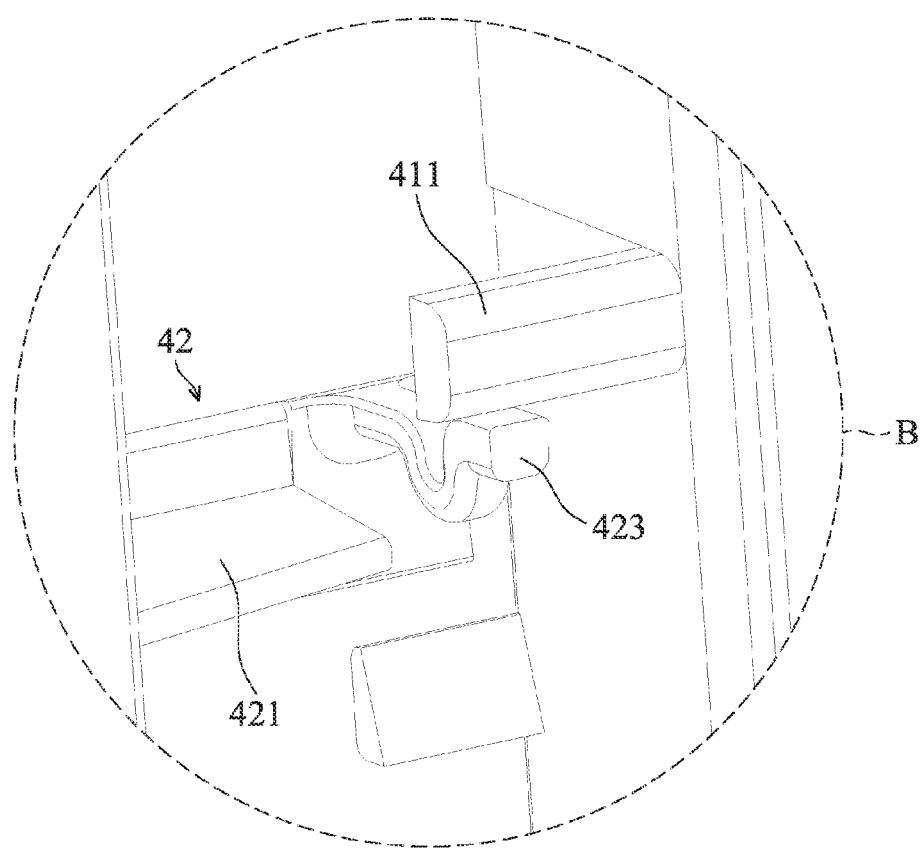
FIG. 10B is an enlarged view of part B of FIG. 10A.

FIG. 10A is a perspective view of a wafer positioning mechanism 40 in accordance with some embodiments of the disclosure. FIG. 10B is an enlarged view of part A of FIG. 10A. As shown in FIG. 10A, wafer positioning mechanism 40 is at the release position. Resilient portion 423 is away from blocking portion 411.

As shown in FIGS. 10A and 10B, wafer positioning mechanism 40 is at the retaining position. In FIG. 10B, resilient portion 423 abuts against blocking portion 411. Therefore, a force generated by linking bar 42 is applied to pushing element 43 when wafer positioning mechanism 40 is at a retaining position.

Figure 10C:
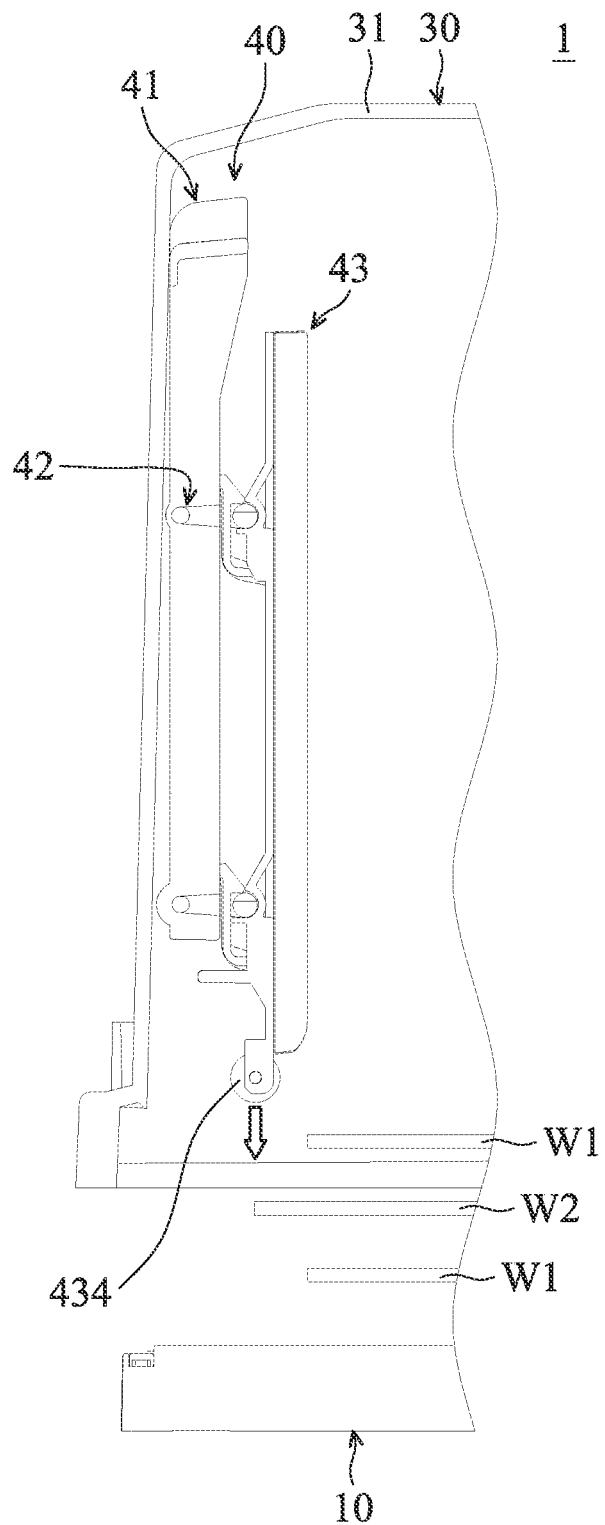
FIG. 10C is a schematic view of the wafer pod in a jammed position in accordance with some embodiments of the disclosure.

FIG. 10C is a schematic view of wafer pod 1 in accordance with some embodiments of the disclosure. As shown in FIG. 10C, pod shell 30 is moved toward pod door 10, and wafer W2 is protruded relative to wafer W1. However, in FIG. 10C, wafer positioning mechanism 40 is jammed, and wafer positioning mechanism 40 is held at the retaining position. If wafer positioning mechanism 40 is continually moved to pod door 10, wafer W2 may be damaged by resilient portion 423.

Due to resilient portion 423 and blocking portion 411 of the disclosure, linking bar 42 may be rotated to push pushing element 43 to move down. Therefore, wafer positioning mechanism 40 in FIG. 10C may be moved to the release position, and the described situation in FIG. 10C may be prevented.

Embodiments of mechanisms for a wafer pod containing at least one wafer are provided. Retaining protrusions and a pod housing are formed as a single piece, and therefore the particles in the wafer pod are decreased. Wafers are prevented from possible pollution by remaining water or liquid, since there is no groove formed on a fixing protrusion and a bottom surface of a pod shell. A pushing element of a wafer positioning mechanism is prevented from keeping at a retaining position when the pushing element does not contact with the wafers. Further, the wafer positioning mechanism is prevented from dropping off at a retaining position.

In some embodiments, a wafer positioning mechanism is provided. The wafer positioning mechanism includes a base including a blocking portion, and a linking bar pivoted on the base and including a resilient portion. The wafer positioning mechanism also includes a pushing element pivoted on the linking shaft. Further, when the pushing element is at a retaining position, the resilient portion abuts against the blocking portion, and a force generated by the linking bar is applied to the pushing element.

In some embodiments, a wafer positioning mechanism is provided. The wafer positioning mechanism includes a base including a blocking portion, and a linking bar pivoted on the base. The linking bar includes a linking body, pivoted on the base, a linking shaft disposed on the linking body and having a trench, and a resilient portion disposed on the linking body. The wafer positioning mechanism also includes a pushing element pivoted on the linking shaft. The pushing element includes a pushing body, a pivoting portion disposed on the pushing body and having a pivoting slot, and a holding portion disposed on the pushing body and having a blocking surface. Further, the linking shaft is rotatably disposed in the pivoting slot. When the pushing element is at a retaining position, a bottom surface of the trench faces the blocking surface, the resilient portion abuts against the blocking portion, and a force generated by the linking bar is applied to the pushing element.

In some embodiments, a wafer pod for containing at least one wafer is provided. The wafer pod includes a pod door and a cassette disposed on the pod door and containing the at least one wafer. The wafer pod also includes a pod shell which is detachably disposed on the pod door and covers the cassette. The wafer positioning mechanism includes a base disposed on an inner surface of the pod shell and including a blocking portion, a linking bar pivoted on the base and including a resilient portion, and a pushing element pivoted on the linking shaft. Further, when the pushing element is at a retaining position, the resilient portion abuts against the blocking portion, and a force generated by the linking bar is applied to the pushing element.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A wafer positioning mechanism, comprising:
   a base comprising a blocking portion;
   a linking bar, pivoted on the base, comprising a resilient portion; a linking shaft; and
   a pushing element pivoted on the linking shaft,
   wherein when the pushing element is at a retaining position, the resilient portion abuts against the blocking portion, and a force generated by the linking bar is applied to the pushing element.

2. The wafer positioning mechanism as claimed in claim 1, wherein the linking bar comprises:
   a linking body, pivoted on the base, wherein the resilient portion is disposed on the linking body; and
   a linking shaft disposed on the linking body.

3. The wafer positioning mechanism as claimed in claim 2, wherein the pushing element comprises:
   a pushing body;
   a pivoting portion, disposed on the pushing body, having a pivoting slot; and
   a holding portion, disposed on the pushing body,
   wherein the linking shaft is rotatably disposed in the pivoting slot, and the linking shaft is located between the holding portion and the pivoting slot.

4. The wafer positioning mechanism as claimed in claim 3, wherein the holding portion has a blocking surface, and the linking shaft has a trench, wherein when the pushing element is at a retaining position, a bottom surface of the trench faces the blocking surface.

5. The wafer positioning mechanism as claimed in claim 3, wherein the pushing element comprises a wheel disposed on the pushing body.

6. A wafer positioning mechanism, comprising:
   a base comprising a blocking portion;
   a linking bar, pivoted on the base, comprising:
      a linking body, pivoted on the base;
      a linking shaft, disposed on the linking body, having a trench; and
      a resilient portion disposed on the linking body; and
   a pushing element, pivoted on the linking shaft, comprising:
      a pushing body;
      a pivoting portion, disposed on the pushing body, having a pivoting slot, wherein the linking shaft is rotatably disposed in the pivoting slot; and
      a holding portion, disposed on the pushing body, having a blocking surface,
   wherein when the pushing element is at a retaining position, a bottom surface of the trench faces the blocking surface, the resilient portion abuts against the blocking portion, and a force generated by the linking bar is applied to the pushing element.

7. The wafer positioning mechanism as claimed in claim 6, wherein the bottom surface and the blocking surface are flat surfaces.

8. The wafer positioning mechanism as claimed in claim 6, wherein the holding portion comprises:
   a resilient arm, disposed on the pushing body; and
   a hook structure, disposed on the resilient arm, having the blocking surface,
   wherein the linking shaft is located between the hook structure and the pivoting slot.

9. The wafer positioning mechanism as claimed in claim 6, wherein the pushing body is substantially parallel to a plane, and the blocking surface is substantially perpendicular to the plane.

10. The wafer positioning mechanism as claimed in claim 6, wherein the pushing element comprises a wheel disposed on the pushing body.

11. A wafer pod for containing at least one wafer, comprising:
    a pod door;
    a cassette, disposed on the pod door, containing the at least one wafer;
    a pod shell, detachably disposed on the pod door, covering the cassette; and
    a wafer positioning mechanism, comprising:
       a base, disposed on an inner surface of the pod shell, comprising a blocking portion;
       a linking bar, pivoted on the base, comprising a resilient portion; a linking shaft; and
       a pushing element pivoted on the linking shaft,
       wherein when the pushing element is at a retaining position, the resilient portion abuts against the blocking portion, and a force generated by the linking bar is applied to the pushing element.

12. The wafer pod as claimed in claim 11, wherein the pod door comprises a pod housing and a plurality of retaining protrusions disposed thereon, wherein the cassette is retained by the retaining protrusions, and the pod housing and the retaining protrusions are formed as a single piece.

13. The wafer pod as claimed in claim 12, wherein the cassette comprises a retaining plate and a retaining rib disposed on the retaining plate, and the retaining plate and the retaining rib are retained by the retaining protrusions.

14. The wafer pod as claimed in claim 11, wherein the pod shell includes a shell body, a fixing protrusion disposed in the inner surface, and a damping element having a fixing groove, wherein the fixing protrusion is detachably retained in the fixing groove.

15. The wafer pod as claimed in claim 11, wherein the pod shell comprises a shell body having a receiving chamber therein, a bottom surface, and a shell opening formed on the bottom surface and communicated with the receiving chamber, wherein the bottom surface excludes any groove formed thereon.

16. The wafer pod as claimed in claim 11, wherein the pushing element is substantially parallel to a plane during the movement thereof, and the linking bar is pivoted on the base about a rotation axis, and the rotation axis is located at the plane.

17. The wafer positioning mechanism as claimed in claim 11, wherein the linking bar comprises:
    a linking body, pivoted on the base, wherein the resilient portion is disposed on the linking body; and
    a linking shaft disposed on the linking body.

18. The wafer positioning mechanism as claimed in claim 17, wherein the pushing element comprises:
- a pushing body;
- a pivoting portion, disposed on the pushing body, having a pivoting slot; and
- a holding portion, disposed on the pushing body,
- wherein the linking shaft is rotatably disposed in the pivoting slot, and the linking shaft is located between the holding portion and the pivoting slot.

19. The wafer positioning mechanism as claimed in claim 18, wherein the holding portion has a blocking surface, and the linking shaft has a trench, wherein when the pushing element is at a retaining position, a bottom surface of the trench faces the blocking surface.

20. The wafer pod as claimed in claim 19, wherein the bottom surface and the blocking surface of the trench are flat surfaces.

* * * * *